United States Patent [19]
Roh et al.

[11] Patent Number: 5,476,806
[45] Date of Patent: Dec. 19, 1995

[54] SEMICONDUCTOR DEVICE AND METHOD FOR MAKING THEREOF

[75] Inventors: Jae-sung Roh, Kyunggi; Hyeung-Tae Kim, Seoul, both of Rep. of Korea

[73] Assignee: Goldstar Electron Co., Ltd., Cheongju, Rep. of Korea

[21] Appl. No.: 195,234

[22] Filed: Feb. 14, 1994

[30] Foreign Application Priority Data

Feb. 12, 1993 [KR] Rep. of Korea ............... 1993/1898

[51] Int. Cl.$^6$ ................................................. H01L 21/8242
[52] U.S. Cl. ............................ 437/52; 437/47; 437/60; 437/919
[58] Field of Search ................................. 437/47, 48, 52, 437/60, 919, 228; 257/306

[56] References Cited

U.S. PATENT DOCUMENTS

| | | | |
|---|---|---|---|
| 5,192,702 | 3/1993 | Tsemy | 437/52 |
| 5,314,835 | 5/1994 | Iguchi et al. | 437/52 |

OTHER PUBLICATIONS

"Spreaded-Vertical-Capacitor Cell (SVC) For Beyond 64MBit Drams", N. Matsuo, et al., IEDM 1991 pp. 473–476.

*Primary Examiner*—Tom Thomas
*Attorney, Agent, or Firm*—Alan R. Loudermilk

[57] ABSTRACT

The capacitor area is increased with a cylinder-shaped first storage electrode overlapped with a second electrode in an area which covers two adjacent cells. Included in a semiconductor device using the invention may be: a semiconductor substrate; a word line on the substrate; impurity regions at opposite sides of the word line in the substrate; a first contact hole on an odd impurity region; a first storage electrode connected to the first contact hole, which is overlapped with an adjacent even cell; a first sidewall storage electrode at opposite sides of the fist storage electrode; a second contact hole on the even impurity region, the second contact hole having a insulated sidewall; a second storage electrode connected to the second contact hole, which is overlapped with an adjacent odd cell; a second sidewall storage electrode at opposite sides of the second storage electrode.

14 Claims, 7 Drawing Sheets

FIG. 6

SEMICONDUCTOR DEVICE AND METHOD FOR MAKING THEREOF

FIELD OF THE INVENTION

The present invention relates to semiconductor devices and methods for making thereof, and more particularly to semiconductor devices with a stacked capacitor having a stacked capacitor area that is overlapped with a capacitor area of an adjacent stacked capacitor.

BACKGROUND OF THE INVENTION

There are conventional methods of making a capacitor in a semiconductor memory device such as is illustrated in FIG. 1, and also the Spread Vertical Capacitor (SVC) method which is discussed in IEDM '91, at pages 473–476.

FIG. 1 illustrates a method of making a capacitor in a semiconductor memory device by a conventional method.

Figure 1A:
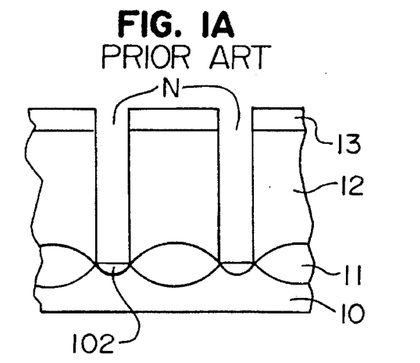
FIG. 1(A)–1(D) illustrates partial sectional views for explanation of a method of making a capacitor in a semiconductor memory cell according to a conventional method.

As illustrated in FIG. 1(A), field oxide insulator 11 is formed on silicon substrate 10 and source/drain regions 102 are formed. Thereafter, silicon oxide layer 12 and nitride layer 13 are deposited in the cited order on the overall surface of silicon substrate 10. Contact holes N are formed over and to source/drain regions 102 of silicon substrate 10.

Figure 1B:
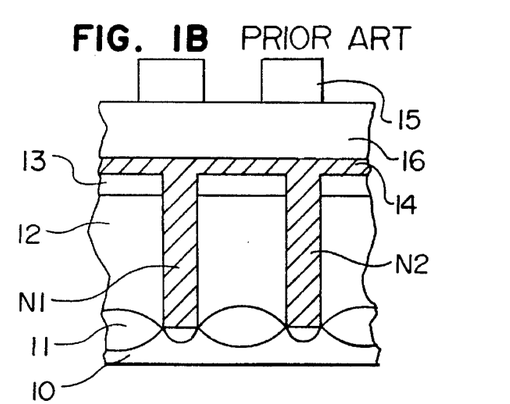

As illustrated in FIG. 1(B), after polysilicon layer 14 to be used as a storage electrode node is deposited in contact holes N1 and N2 and on nitride layer 13, silicon oxide layer 16 and nitride layer 15 are deposited on polysilicon layer 14 in the cited order.

Nitride layer pattern 15 is defined to be used as a mask for etching a portion of silicon oxide layer 16 by a photolithographic process.

Figure 1C:
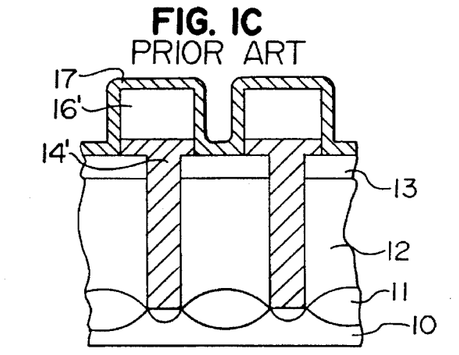

As illustrated in FIG. 1(C), silicon oxide layer pattern 16' and polysilicon layer pattern 14' are defined by an anisotropic etching with a mask of nitride layer pattern 15, using nitride layer 13 as an etch-stopping layer.

After nitride layer pattern 15 is removed, polysilicon layer 17 is deposited on the surface and sides of silicon oxide layer 16, the sides of polysilicon layer pattern 14' and on nitride layer 13.

Figure 1D:
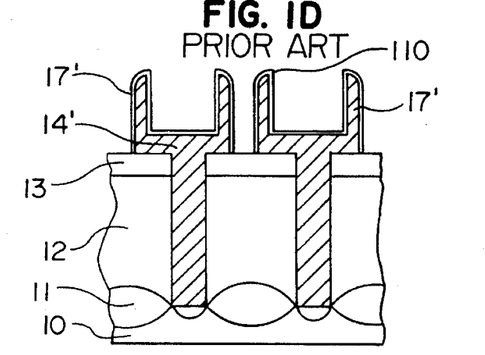

As illustrated in FIG. 1(D), after sidewall spacer 17' is formed around silicon oxide layer pattern 16' by a reactive ion etching of polysilicon layer 17, a cylinder-shaped storage electrode is formed by etching silicon oxide layer pattern 16' in an HF solution.

Dielectric layer 110 is formed on the cylinder-shaped storage electrode, and a capacitor plate electrode (not shown) is formed on dielectric layer 110. The method of making the capacitor thus is completed.

Figure 2:
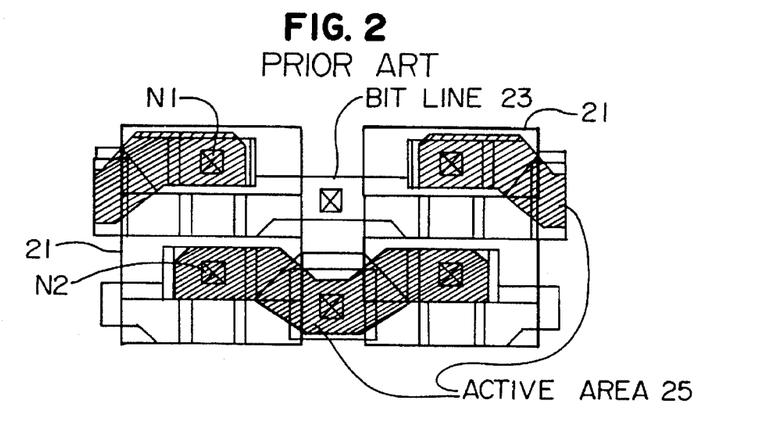
FIG. 2 illustrates a layout of a semiconductor memory cell in accordance with FIG. 1.

FIG. 2 illustrates a layout of a capacitor which is fabricated in accordance with the method as illustrated in FIG. 1. Rectangle area 21 represents a capacitor area of a cell, N1 and N2 represent contacts. Also shown are bit lines 23 and active area 25.

FIG. 3 illustrates the SVC method of making a capacitor in a semiconductor memory device.

Figure 3A:
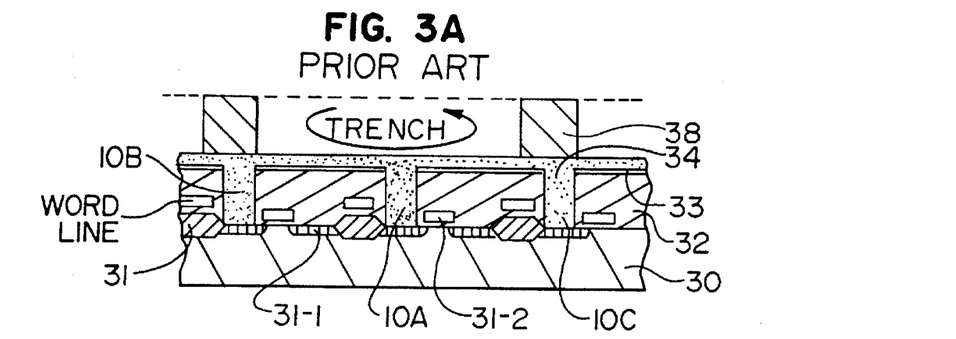
FIG. 3A–3D illustrate partial sectional views for explanation of a method of making a capacitor in a semiconductor memory cell according to a SVC method.

As illustrated in FIG. 3(A), after formation of field insulator 31, circuit elements such as source/drain regions 31-1 and word lines 31-2 are formed on silicon substrate 30, and insulating layer 32 and nitride layer 33 are deposited on silicon substrate 30 in the cited order.

Contact holes 10A, 10B, 10C are formed onto source/drain regions 31-1, and polysilicon layer 34 is deposited on substrate 30. A silicon oxide layer is deposited on polysilicon layer 34 and a trench is formed in the silicon oxide layer, resulting in silicon oxide layer pattern 38.

Figure 3B:
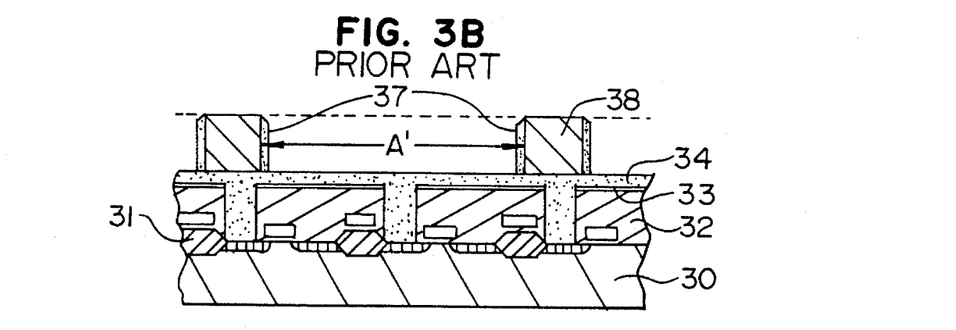

As illustrated in FIG. 3(B), a polysilicon layer is deposited on the surface, and storage electrode 37 is formed by anisotropic dry etching of the polysilicon layer.

Figure 3C:
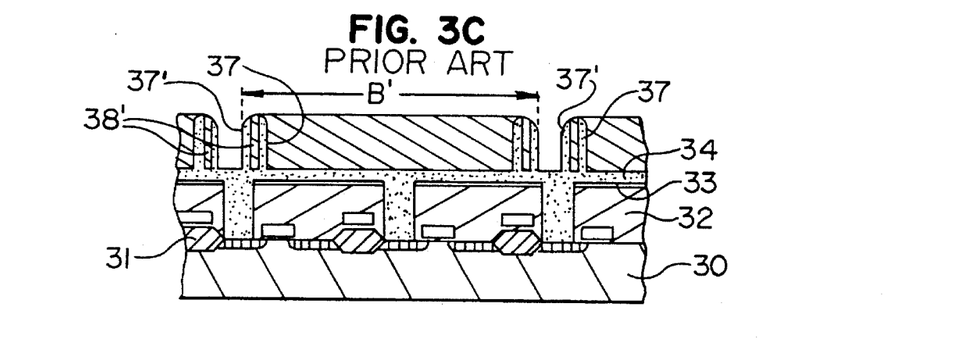

As illustrated in FIG. 3(C), after silicon oxide pattern 38 is removed, sidewall spacer 38' of silicon oxide is formed at the outer side of storage electrode 37 and a polysilicon layer is formed on the surface. Storage electrode 37' is formed by etching anisotropically the polysilicon layer. Storage electrode 37 has nearly the same capacitance as storage electrode 37' on account of a difference in height (the height of electrode 37' is smaller than the height of electrode 37).

Figure 3D:
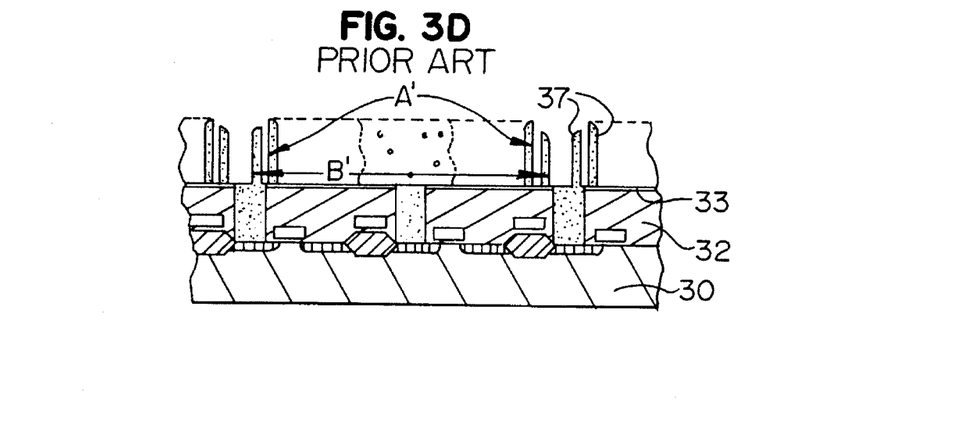

As illustrated in FIG. 3(D), after sidewall spacer 38' is removed, storage electrode 37 (A') is isolated electrically from storage electrode 37' (B') by anisotropic dry etching of the whole surface of silicon substrate 30. An ONO (dielectric) layer (not shown) and a plate electrode (not shown) are formed on storage electrodes A' and B' in the cited order.

Figure 4:
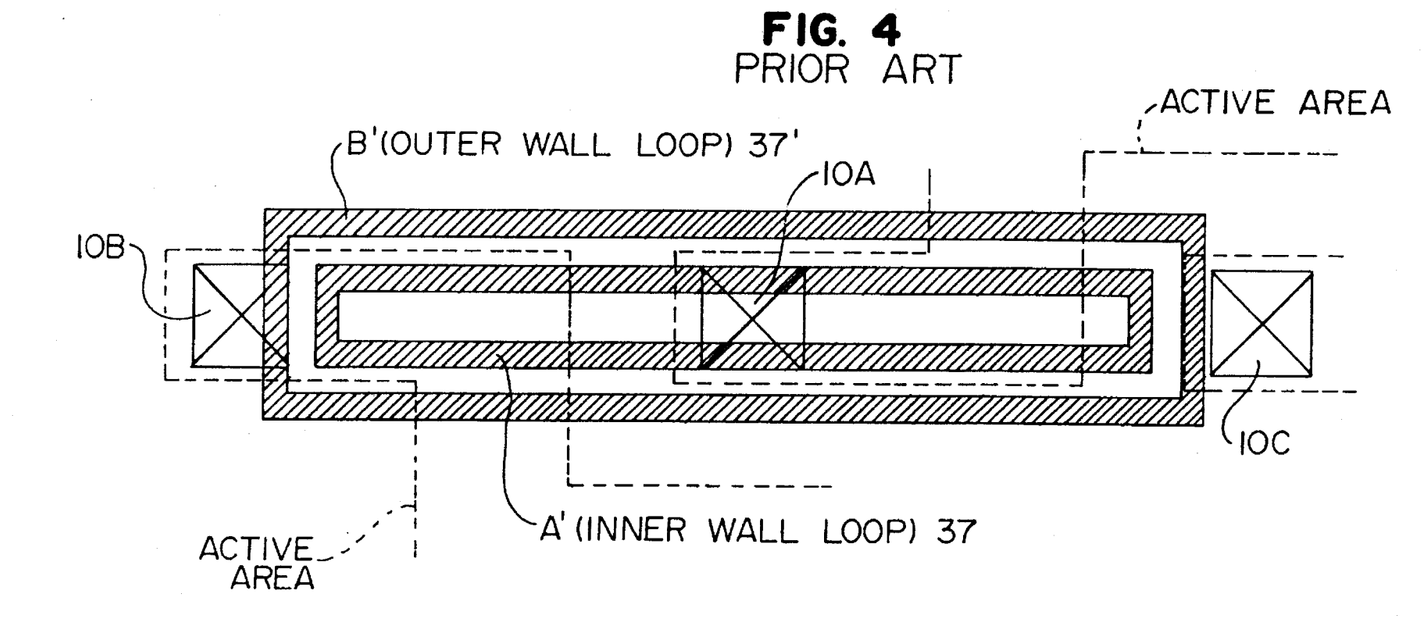
FIG. 4 illustrates a layout of a capacitor in a semiconductor memory device according to the SVC method.

FIG. 4 illustrates a layout of a capacitor which is fabricated in accordance with the SVC method, wherein storage electrode A' is connected to electrode contact 10A, and storage electrode B' which can be made by self-alignment is connected to electrode contact 10B. The dashed lines illustrate active areas.

In conventional methods such as illustrated in FIG. 1 and FIG. 2, it is a problem that the area of a storage electrode, which is a measure of its capacitance, is limited within a single cell, naturally causing difficulties in making ultrahighly integrated memory cells.

The SVC method as illustrated in FIG. 3 and FIG. 4 has a problem of strict alignment margin. In addition, the SVC method has a weak point of an increased resistance generated from the narrow alignment margin as outer wall loop B' in FIG. 4 is connected to a portion of electrode contact 10B, and the capacitance area of storage electrode A' is confined only within the wall of inner loop A'.

SUMMARY OF THE INVENTION

In order to overcome such problems as described above with conventional methods, in the present invention a capacitance area is extended to the area of an adjacent capacitor of another memory cell and the resistance originating from a storage node contact may be reduced.

Accordingly, it is an object of the present invention to provide a method for making a semiconductor device, which includes the steps of: forming a word line on a semiconductor substrate; forming in the substrate first impurity region on one side of the word line and odd and even second impurity regions on the opposite side of the word line; forming a first insulating layer on the surface; forming a first contact hole to an odd impurity region; forming a first conductive layer on the first insulating layer and in the first contact hole, and a second insulating layer on the first conductive layer; forming a second contact hole to an even impurity region; forming a contact hole insulating sidewall in the second contact hole; forming a second conductive layer on the second insulating layer and in the second contact hole; forming a primary storage electrode by etching the second conductive layer except for a capacitor storage electrode region, and forming a side wall spacer around the primary storage electrode with an insulator; etching the second insulating layer using the second conductive layer and the side wall spacer as a mask; etching back the first conductive layer and a part of the second conductive layer;

forming capacitor storage electrodes by depositing a conductive layer and etching it back, resulting in the formation of conductive layer side wall spacers at both sides of the side wall spacer; and forming a dielectric layer and a plate electrode on the storage electrodes.

It is another object of the present invention to provide a method for making a semiconductor device, comprising the steps of: forming a word line on a semiconductor substrate; forming a first impurity region and odd and even second impurity regions at the sides of the word line respectively in the substrate; forming a first insulating layer on the surface; forming a bit line contact hole to the first impurity region; forming a bit line on the first insulating layer, filling the bit line contact hole; forming a second insulating layer on the surface; forming a first contact hole to the odd impurity region; forming a first conductive layer on the second insulating layer and in the first contact hole, and a third insulating layer on the first conductive layer; forming a second contact hole to the even impurity region; forming an contact hole insulating sidewall in the second contact hole; forming a second conductive layer on the third insulating layer and in the second contact hole; forming a primary storage electrode by etching the second conductive layer except for a capacitor storage electrode region, and forming a side wall spacer around the primary storage electrode; etching the third insulating layer using the second conductive layer and the side wall spacer as a mask; etching back the first conductive layer and a part of the second conductive layer; forming capacitor storage electrodes by depositing a conductive layer and etching it back, resulting in the formation of conductive layer side wall spacers at both sides of the side wall spacer; and forming a dielectric layer and a plate electrode on the storage electrodes.

It is still another object to provide a semiconductor device comprising: a substrate; a word line on the substrate; impurity regions at opposite sides, respectively, of the word line in the substrate, the impurity regions including odd and even impurity regions; a first capacitor storage electrode having its bottom portion connected to the odd impurity region, the first capacitor storage electrode being overlapped with a second capacitor storage electrode having its bottom portion connected to an adjacent even impurity region.

It is yet another object to provide a semiconductor device comprising: a semiconductor substrate; a word line on the substrate; first and second impurity regions at opposite sides of the word line in the substrate, the second impurity regions including odd and even impurity regions; a bit line connected to the first impurity region: a first contact hole to an odd second impurity region; a first storage electrode connected to the odd second impurity region, the first storage electrode being overlapped with a second storage electrode connected to the even second impurity region; a second contact hole to the even second impurity region, the second contact hole having an insulated sidewall; a second storage electrode connected to the even second impurity region, the second storage electrode being overlapped with the first storage electrode connected to the odd second impurity region.

It is still yet another object to provide a semiconductor device comprising: a semiconductor substrate; a word line on the substrate; impurity regions at opposite sides of the word line in the substrate including odd and even impurity regions; a first contact hole to an odd impurity region; a first storage electrode connected to the odd impurity region through the first contact hole, the first storage electrode being overlapped with a second storage electrode connected to an adjacent even impurity region; a first sidewall storage electrode at opposite sides of the first storage electrode; a second contact hole to the even impurity region, the second contact hole having an insulated sidewall; a second storage electrode connected to the second impurity region through the second contact hole, the second storage electrode being overlapped with a first storage electrode connected to an adjacent odd impurity region; a second sidewall storage electrode at opposite sides of the second storage electrode.

BRIEF DESCRIPTION OF THE DRAWINGS

The above object and other advantages of the present invention will be more apparent by describing in detail the preferred embodiments of the present invention with reference to the attached drawings.

FIG. 5 illustrates partial sectional views for explanation of a method of fabricating a semiconductor device according to the present invention, wherein FIGS. 5(A) to (F) represent cross sectional views bisected along line A—A and FIGS. 5(A') to (F') represent cross sectional views bisected along line A'—A' shown in FIG. 6, respectively.

DESCRIPTION OF THE PREFERRED EMBODIMENTS

FIG. 5 illustrates partial sectional views for explanation of a method of fabricating a semiconductor device according to the present invention. FIGS. 5(A) to (F) and FIGS. 5(A') to (F') represent cross sectional views bisected along lines A—A and A'—A' shown in FIG. 6, respectively. The illustrated embodiment is based on four memory cells in an array structure.

Figure 5A:
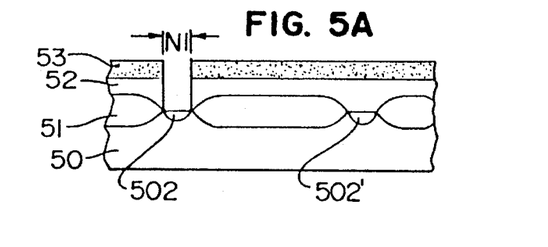

As illustrated in FIGS. 5(A) and 5(A'), after formation of field insulation layer 51, gate insulation layer 586 is formed, and a polysilicon layer and a silicon oxide layer are formed, and then word lines 504 are formed on semiconductor substrate 50.

Side-wall spacers 588 are formed at the sides of word lines 504 by depositing a silicon oxide layer and etching back.

Next, first impurity region 501 and second impurity regions 502 and 502' are formed in silicon substrate 50 and between gate word lines 504.

First insulating layer 52 of silicon oxide is deposited on the surface of silicon substrate 50. Coated on first insulating layer 52, photoresist (not shown) is exposed and developed to form a photoresist pattern (not shown) for forming a bit line contact hole on first impurity region 501.

Bit line contact hole 503' is formed on first impurity region 501 by anisotropically etching first insulating layer 52 with the photoresist pattern (not shown) as an etching mask. After the photoresist pattern (not shown) is removed, polysilicon layer 503 is deposited on first insulating layer 52 and in bit line contact hole 503'. Bit line 503 is formed by a photolithographic process and then second insulating layer 53 of silicon nitride is deposited on first insulating layer 52 and bit line 503.

A photoresist pattern as a mask for forming a first storage electrode contact hole is defined after photoresist is coated on second insulating layer 53. First storage electrode contact hole N1 is formed on second impurity region 502 by anisotropic etching of first and second insulating layers 52 and 53 with the photoresist pattern as a mask. Thereafter, the photoresist pattern (not shown) is removed.

Figure 5B:
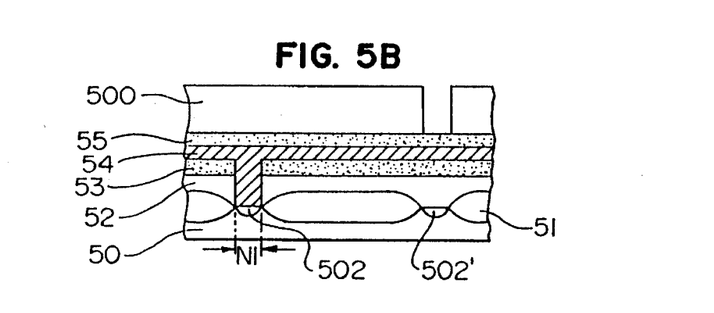

As illustrated in FIGS. 5(B) and 5(B'), first conductive layer 54 of polysilicon is deposited on second insulating layer 53 and in first storage electrode contact hole N1, and third insulating layer 55 of silicon nitride is deposited on first conductive layer 54.

Coated on third insulating layer 53, photoresist is exposed and developed, forming photoresist pattern 500 for use in forming second storage electrode contact hole N2.

Figure 5C:
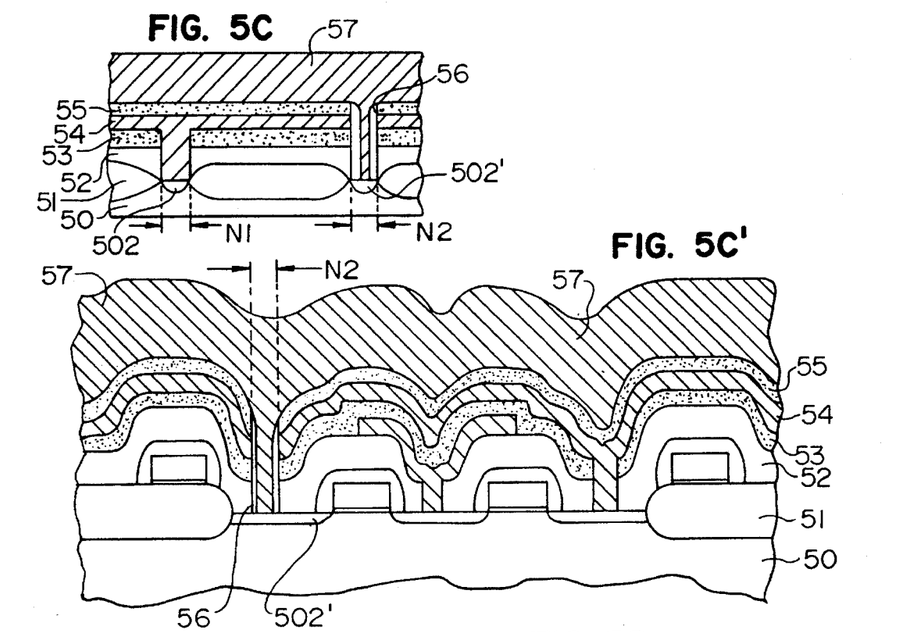

As illustrated in FIGS. 5(C) and 5(C'), second storage electrode contact hole N2 is formed on second impurity region 502' by anisotropic etching of third insulating layer 55, first conductive layer 54, second insulating layer 53, and first insulating layer 52 with photoresist pattern 500 as a mask as illustrated in FIGS. 5(B) and (B'). Thereafter, photoresist pattern 500 is removed.

Fourth insulating layer 56 of silicon oxide is deposited on third insulating layer 55 and in second storage electrode contact hole N2. The thickness of deposited insulating layer 56 is less than the radius of second storage electrode contact hole N2 in which a conductive material can be deposited to couple electrically second impurity region 502' with a storage electrode P2 that will be formed.

Contact hole insulating spacer 56 is formed at the inner side wall of the second storage electrode contact hole N2 by etching back fourth insulating layer 56. Spacer 56 has an important role in isolating the region of second storage electrode contact hole N2 from first conductive layer 54.

Second conductive layer 57 is deposited on third insulating layer 55 and in the region of second storage electrode contact hole N2, wherein the region is surrounded by side wall spacer 56 and second impurity region 502'.

Figure 5D:
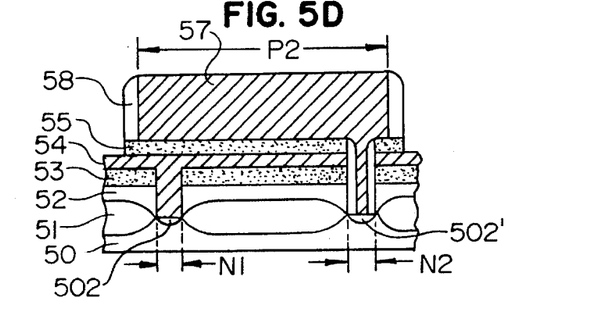

As illustrated in FIGS. 5(D) and (D'), second storage electrode pattern P2 is defined by a photomask etching process with a photoresist pattern (not shown) that covers the area of one cell and that of an adjacent cell. The photoresist pattern (not shown) is formed on second conductive layer 57 and a portion of conductive layer 57 unprotected by the photoresist pattern is etched anisotropically until third insulating layer 55 is exposed.

Fifth insulating layer 58 of silicon oxide is deposited on third insulating layer 55, on and at the sides of second storage electrode pattern P2. Spacer 58 of silicon oxide is formed at the sides of second storage electrode pattern P2 by etching anisotropically fifth insulating layer 58 until third insulating layer 55 is exposed.

Third insulating layer 55 except that beneath second storage electrode pattern P2 and sidewall spacer 58 is removed, exposing portions of first conductive layer 54.

Figure 5E:
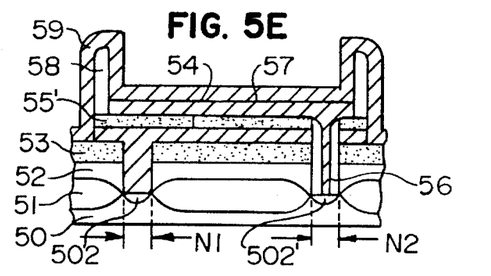

As illustrated in FIGS. 5(E) and 5(E'), first conductive layer 54 except that under the remaining portions of third insulation layer 55' is removed by anisotropic etching until second insulating layer 53 is exposed. Second conductive layer 57 remains to be a part of a second storage electrode despite the anisotropic etching process.

Third conductive layer 59 is deposited on the remaining portions of second conductive layer 57, on and at the side of the sidewall spacers 58, and on the exposed portions of second insulating layer 53.

Figure 5F:
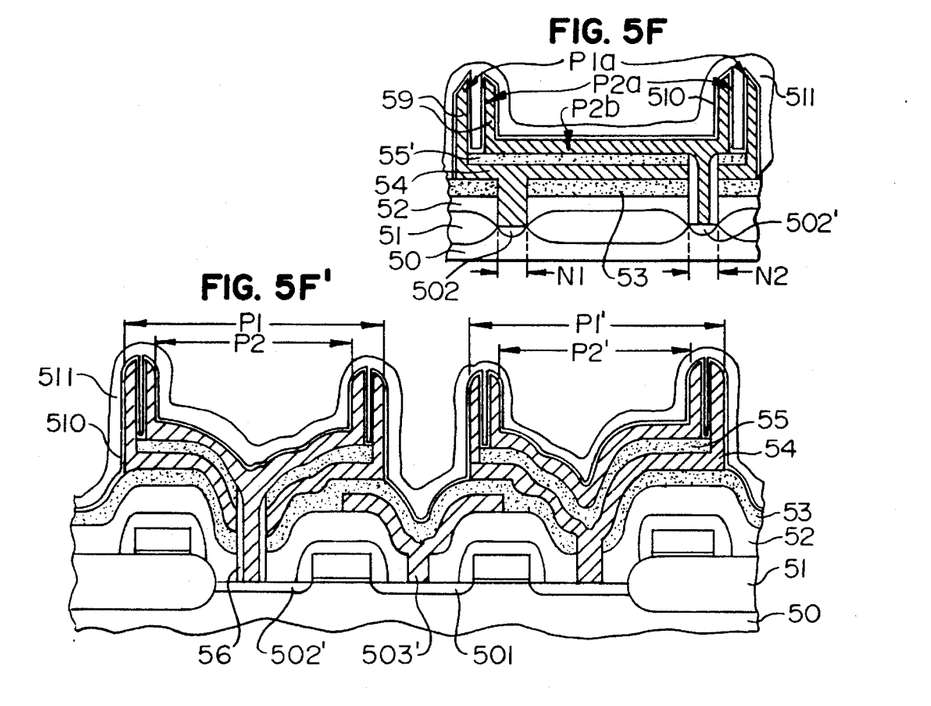

As illustrated in FIGS. 5(F) and (F'), two walls P1a, P2'a are formed to be a part of storage electrodes by etching anisotropically third conductive layer 59 using second insulating layer 53 of silicon nitride as an etch-stop layer. Outer wall P1a becomes a part of a first storage electrode and inner wall P2 becomes a part of a second storage electrode.

First storage electrode P1 and second storage electrode P2 are formed by a wet etching of sidewall spacer 58. Electrodes P1 and P2 are cylinder-shaped, and first storage electrode P1 lies under second storage electrode P2.

First storage electrode P1 is connected to odd second impurity region 502, and is overlapped with second storage electrode P2, which is connected to even second impurity region 502'.

Finally, dielectric layer 510 is formed on storage electrodes P1 and P2. Storage electrodes P1 and P2 have nearly the same capacitance as each other due to the difference between the height of wall P1a and that of wall P2a, i.e., P2a is smaller than P1a, while second storage electrode P2 has a capacitance area on the surface of wall P2a and on a surface of flat area P2b, while first storage electrode P1 has a capacitance area on the surface of wall P1a only.

Plate electrode 511 is formed on dielectric layer 510. Consequently, a capacitor is fabricated of which the capacitance area is extended to an adjacent cell, enabling highly increased integration in a semiconductor memory device.

Figure 6:
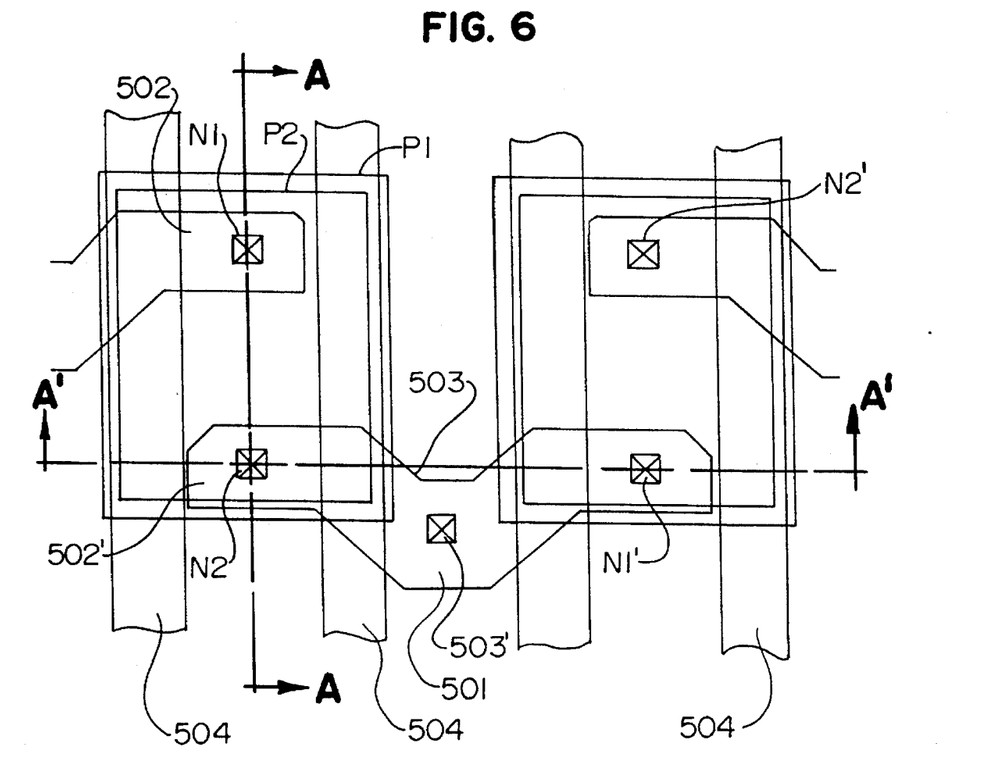
FIG. 6 illustrates a layout of a capacitor fabricated in accordance with the present invention.

FIG. 6 illustrates a layout of four stacked capacitors in a unit of four memory cells according to the present invention, wherein lines A—A and A—A' are the guide lines to represent cross sectional views for FIGS. 5(A)–(F) and 5(A')–(F'), respectively. There are illustrated: word lines 504 on a silicon substrate; even second impurity region 502' and odd second impurity region 502 between word lines 504; first impurity region 501; bit line contact hole 503' on first impurity region 501; first storage electrode node contact hole N1 at odd second impurity region 502; second storage electrode node contact hole N2 at even second impurity region 502'; first storage electrode P1 which is coupled with odd second impurity region 502 via first storage electrode node contact hole N1; and second storage electrode P2 which is coupled with even second impurity region 502' via second storage electrode node contact hole N2, wherein second storage electrode P2 is surrounded by first storage electrode P1.

According to the present invention as described above, the capacitance area of each capacitor is increased about doubly because a cylinder-shaped first capacitor P1 is formed on an area which covers two adjacent cells and which is shared by second capacitor P2 on first capacitor P1, while the capacitance area of second storage electrode P2 includes flat area P2b.

Moreover, the present invention reduces resistance generated from the alignment margin by connecting storage electrodes thoroughly to the plugs of the storage electrode node contacts, resulting in improved reliability and ultra high integration of a semiconductor device.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for making a semiconductor device, comprising the steps of:
   forming a word line on a semiconductor substrate;
   forming an odd impurity region and an even impurity region at one side of the word line in the substrate;
   forming a first insulating layer on the substrate and the word line;
   forming a first contact hole to the odd impurity region;
   forming a first conductive layer on the first insulating layer and in the first contact hole, wherein the first conductive layer contacts the odd impurity region;
   forming a second insulating layer on the first conductive layer;
   forming a second contact hole to the even impurity region;
   forming an insulating sidewall in the second contact hole;
   forming a second conductive layer on the second insulating layer and in the second contact hole, wherein the second conductive layer contacts the even impurity region;
   etching the second conductive layer except for a capacitor storage electrode region, and forming an insulating side wall spacer around the second conductive layer;
   etching the second insulating layer and the first conductive layer using the second conductive layer and the insulating side wall spacer as a mask, wherein the etching thins the second conductive layer;
   forming first and second conductive side walls at the sides of the insulating side wall spacer, wherein the first conductive side wall contacts the first conductive layer and the second conductive side wall is formed on and contacts the second conductive layer; and
   forming a dielectric layer and a plate electrode on the first and second conductive side walls and on the second conductive layer.

2. The method of claim 1, wherein the first and second insulating layers comprise silicon nitride.

3. The method of claim 1, wherein the insulating sidewall in the second contact hole and the insulating side wall spacer comprise silicon oxide.

4. The method of claim 1, wherein the first conductive layer and the second conductive layer comprise polysilicon.

5. A method for making a semiconductor device, comprising the steps of:
   forming a word line on a semiconductor substrate;
   forming a first impurity region on one side of the word line in the substrate and an odd second impurity region and an even second impurity region at the other side of the word line in the substrate;
   forming a first insulating layer on the substrate;
   forming a bit line contact hole through the first insulating layer to the first impurity region;
   forming a bit line on the first insulating layer, wherein the bit line fills the bit line contact hole and contacts the first impurity region;
   forming a second insulating layer on the first insulating layer and the bit line;
   forming a first contact hole to the odd second impurity region;
   forming a first conductive layer on the second insulating layer and in the first contact hole, wherein the first conductive layer contacts the odd impurity region;
   forming a third insulating layer on the first conductive layer;
   forming a second contact hole to the even second impurity region;
   forming an insulating sidewall in the second contact hole;
   forming a second conductive layer on the third insulating layer and in the second contact hole, wherein the second conductive layer contacts the even impurity region;
   etching the second conductive layer except for a capacitor storage electrode region, and forming a side wall spacer around the second conductive layer;
   etching the third insulating layer and the first conductive layer using the second conductive layer and the side wall spacer as a mask, wherein the etching thins the second conductive layer;
   forming first and second conductive side walls at the sides of the side wall spacer, wherein the first conductive side wall contacts the first conductive layer and the second conductive side wall is formed on and contacts the second conductive layer; and
   forming a dielectric layer and a plate electrode on the first and second conductive side walls and on the second conductive layer.

6. The method of claim 5, wherein the second and third insulating layers comprise silicon nitride.

7. The method of claim 5, wherein the insulating sidewall in the second contact hole and the side wall spacer comprise silicon oxide.

8. The method of claim 5, wherein the first conductive layer and the second conductive layer comprise polysilicon.

9. The method of claim 5, wherein the bit line comprises polysilicon.

10. A method of forming a memory array in a semiconductor device, the memory array including left and right halves, with each left and right half of the memory array including odd and even memory cells, with each odd memory cell having an odd word line and each even memory cell having an even word line, wherein the memory array further includes a bit line positioned between the left and right halves of the memory array, the method comprising:
    forming the odd and even word lines for both halves of the memory array on a semiconductor substrate;
    forming a first impurity region in the substrate between the even word lines of the two halves of the memory array, and forming odd and even second impurity regions in the substrate in both halves of the memory array between the odd and even word lines;
    forming a first insulating layer on the substrate and on the odd and even word lines;
    forming a bit line contact hole through the first insulating layer to the first impurity region;
    forming a bit line on the first insulating layer and in the bit line contact hole, wherein the bit line contacts the first impurity region;
    forming a second insulating layer on the first insulating layer and the bit line;
    forming first contact holes to the odd second impurity regions of each half of the memory array;
    forming a first conductive layer on the second insulating layer and in the first contact holes, wherein the first conductive layer contacts the odd impurity regions of each half of the memory array;
    forming a third insulating layer on the first conductive layer;

forming second contact holes to the even second impurity regions of each half of the memory array;

forming an insulating sidewall in the second contact holes;

forming a second conductive layer on the third insulating layer and in the second contact holes, wherein the second conductive layer contacts the even impurity regions of each half of the memory array;

etching the second conductive layer except for capacitor storage electrode regions of each half of the memory array;

forming a side wall spacer around the second conductive layer in the capacitor storage electrode regions in both halves of the memory array;

etching the third insulating layer and the first conductive layer using the second conductive layer and the side wall spacers as a mask, wherein the etching thins the second conductive layer in both halves of the memory array;

forming first and second conductive side walls at the sides of the side wall spacers in both halves of the memory array, wherein in each half of the memory array the first conductive side wall contacts the first conductive layer and the second conductive side wall is formed on and contacts the second conductive layer; and forming a dielectric layer and a plate electrode on the first and second conductive side walls and on the second conductive layer in both halves of the memory array.

11. The method of claim 10, wherein the second and third insulating layers comprise silicon nitride.

12. The method of claim 10, wherein the insulating sidewall in the second contact hole and the side wall spacer comprise silicon oxide.

13. The method of claim 10, wherein the first conductive layer and the second conductive layer comprise polysilicon.

14. The method of claim 10, wherein the bit line comprises polysilicon.

* * * * *